(12) United States Patent
Bakker

(10) Patent No.: US 6,947,118 B2
(45) Date of Patent: Sep. 20, 2005

(54) LITHOGRAPHIC APPARATUS AND METHOD OF MANUFACTURING A DEVICE

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/740,828

(22) Filed: Dec. 22, 2003

(65) Prior Publication Data

US 2005/0134814 A1   Jun. 23, 2005

(51) Int. Cl.[7] .......................... G03B 27/52; G03B 27/42
(52) U.S. Cl. .......................................... 355/30; 355/53
(58) Field of Search .................. 355/30, 53; 250/492.1

(56) References Cited

U.S. PATENT DOCUMENTS 6,633,045 B1 * 10/2003 Sugihara et al. ......... 250/492.1
6,740,891 B2 * 5/2004 Driessen et al. ......... 250/492.1
6,744,374 B1 * 6/2004 Kuenzner ............... 340/815.78
2003/0137643 A1 * 7/2003 Jacobs et al. ................ 355/53

FOREIGN PATENT DOCUMENTS

EP     1 211 562 A1    6/2002

* cited by examiner

Primary Examiner—Henry Hung Nguyen
(74) Attorney, Agent, or Firm—Pillsbury Winthrop Shaw Pittman LLP

(57) ABSTRACT

A lithographic apparatus includes a vacuum chamber provided with a first gas evacuator, a conduit in communication with a component inside the vacuum chamber. The apparatus also includes a conduit shield inside the vacuum chamber. The conduit shield provides a conduit path for at least a part of the conduit, and shields the vacuum chamber from the conduit path. The apparatus further includes a gas evacuation shield, extending at least between a gas passage through the conduit shield and a separate gas evacuation feedthrough through a wall of the vacuum chamber. The gas evacuation shield provides a gas evacuation path from the conduit path into an area outside the vacuum chamber, and shields the vacuum chamber from the gas evacuation path.

10 Claims, 4 Drawing Sheets

LITHOGRAPHIC APPARATUS AND METHOD OF MANUFACTURING A DEVICE

BACKGROUND OF THE INVENTION

1. Field of the Invention

The present invention relates to a lithographic apparatus and method manufacturing a device. The present invention also relates to a device used in conjunction with conduits in a vacuum chamber.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In a lithographic apparatus, the size of features that can be imaged onto the substrate is limited by the wavelength of the projection radiation. To produce integrated circuits with a higher density of devices and hence higher operating speeds, it is desirable to be able to image smaller features. Whilst most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser produced plasma sources, discharge plasma sources or synchrotron radiation from electron storage rings.

Other proposed radiation types include electron beams and ion beams. These types of beam share with EUV the requirement that the beam path, including the mask, substrate and optical components, be kept in a high vacuum, to prevent absorption and/or scattering of the beam. In addition, optical elements for EUV radiation can be contaminated, by the deposition of carbon layers on their surface, which imposes the additional requirement that hydrocarbon partial pressures should generally be kept as low as possible.

Working in a high vacuum imposes quite onerous conditions on the components that may be put into the vacuum. For components inside the vacuum chamber, materials that minimize or eliminate contaminant and total outgassing, i.e. both outgassing from the materials themselves and from gases adsorbed on their surfaces, should be used. Conduits can be made of plastics materials such that they are flexible enough. These types of materials often are deleterious to the vacuum in the vacuum chamber because outgassing of contaminants as described above will occur. There are plastics better suited for vacuum applications (for example Teflon) but the large number of cables and lines which are to be lead through the vacuum present a large surface area to outgassing of contaminants. Furthermore, the risk of leaks from conduits makes their use impractical. It would be very desirable to be able to reduce the use of conduits. However, conventional designs of substrate, mask and transfer stages are very complicated and employ large numbers of sensors and drive arrangements, which all need a large numbers of conduits for conveying water and gases and for protecting electric wiring.

Measures to circumvent this known problem related to outgassing of conduits inside the vacuum chamber of a lithographic apparatus are known from the European patent publication 1 211 562. From this prior art document a lithographic apparatus is known which comprises a vacuum chamber provided with a first gas evacuator for generating a vacuum beam path for the projection beam. This known apparatus further comprises a conduit shield for shielding the vacuum chamber from a space containing the conduits, and a second gas evacuator for providing a vacuum in the space. The conduit shield extends, together with the conduits contained in it, through a wall of the vacuum chamber. Thus the major part of contaminants due to outgassing of conduits can be evacuated from the space before these contaminants can reach the high vacuum of the vacuum chamber. In this way the problem related to outgassing of conduits inside the vacuum chamber of a lithographic apparatus is circumvented.

A disadvantage of the apparatus known from EP 1 211 562 is, that it is quite cumbersome to make adaptations in the numbers, types and trajectories of the conduits.

SUMMARY

One aspect of the present invention is to provide a lithographic apparatus in which the conduits can be adapted without requiring complex operations.

According to an aspect of the invention, there is provided a lithographic apparatus comprising: an illumination system constructed to provide a beam of radiation; a support structure constructed to support a patterning device, the patterning device serving to impart a cross-section of the beam of radiation with a pattern to form a patterned beam; a substrate table for holding a substrate; a vacuum chamber provided with a first gas evacuator to generate a vacuum beam path for the beam of radiation; a projection system that projects the patterned beam onto a target portion of the substrate; a first conduit inside the vacuum chamber; a first conduit shield inside the vacuum chamber, providing a first conduit path for at least a part of the first conduit, and shielding the vacuum chamber from the first conduit path; a first gas passage through the first conduit shield; a separate gas evacuation feedthrough through a wall of the vacuum chamber; and a gas evacuation shield extending at least between the first gas passage and the separate gas evacuation feedthrough, providing a gas evacuation path from the first conduit path into an area outside the vacuum chamber, and shielding the vacuum chamber from the first gas evacuation path.

In such a lithographic apparatus conduits can be adapted without complex operations, because no adaptations for the gas evacuation shield and the separate gas evacuation feedthrough are necessary when adaptations have to be made in the numbers, types and trajectories of the conduits. For example, special conduit feedthroughs which usually are already available at different locations in walls of vacuum chambers of lithographic apparatuses, can simply be used for adding and removing different types of conduits.

According to an embodiment of the invention there is provided a lithographic apparatus, further comprising a conduit feedthrough through a wall of the vacuum chamber, and wherein the conduit shield is spaced from the conduit feedthrough. That is, a spacing is present between the conduit feedthrough and the conduit shield. An advantage of this embodiment of the invention is, that the accessibility of the vacuum conduit feedthrough, for example for servicing by an operator or otherwise, is further improved. In particular, the spacing between the conduit shield and the conduit feedthrough allows access to the conduit feedthrough from within the vacuum chamber, and operator accessibility is improved.

According to another embodiment of the invention there is provided a lithographic apparatus, wherein the first gas evacuator is coupled to the gas evacuation shield. Thereby, the first gas evacuator can not only generate a vacuum beam path in the vacuum chamber, but can also provide a vacuum for the conduit path. An advantage of this embodiment of the invention is, that no additional gas evacuator has to be provided for providing a vacuum for the conduit path.

According to a further embodiment of the invention there is provided a lithographic apparatus, further comprising a second gas evacuator coupled to the gas evacuation shield. Thereby, the second gas evacuator can provide a vacuum for the conduit path. An advantage of this embodiment of the invention is, that the vacuum of the conduit path can be controlled independently, because the second gas evacuator can be controlled independently.

According to a yet further embodiment of the invention there is provided a lithographic apparatus, which further comprises a second conduit in communication with a component inside the vacuum chamber; a second conduit shield inside the vacuum chamber, providing a second conduit path for at least a part of the second conduit, and shielding the vacuum chamber from the second conduit path; a second gas passage through the second conduit shield; and wherein the gas evacuation shield furthermore extends between the second gas passage and the separate gas evacuation feedthrough, furthermore provides a second gas evacuation path from the second conduit path into an area outside the vacuum chamber, and furthermore shields the vacuum chamber from the second gas evacuation path.

An advantage of this embodiment of the invention is, that no additional gas evacuation shield and no additional separate gas evacuation feedthrough through the wall of the vacuum chamber have to be provided for the second conduit shield. Another advantage is, that the total evacuating capacity needed for providing a vacuum in both the conduit path and the second conduit path, is less than in case of an additional gas evacuation shield, because of the synergy derived from partial overlap between the first gas evacuation path and the second gas evacuation path.

According to a yet further embodiment of the invention there is provided a lithographic apparatus, wherein the conduit shield further comprises a branched conduit shield, providing a branched conduit path, and shielding the vacuum chamber from the branched conduit path. An advantage of this embodiment of the invention is, that different locations inside the vacuum chamber can be provided with utilities by one or more conduits.

According to a further aspect of the invention, there is provided a method of manufacturing a device, comprising: providing a substrate; providing a beam of radiation; providing a vacuum to a vacuum chamber; effecting communication between a conduit extending within a conduit path and a component inside the vacuum chamber; shielding the vacuum chamber from the conduit path for at least a part of the conduit; imparting a cross-sectional pattern to the beam of radiation and forming a patterned beam; projecting the patterned beam of radiation onto a target portion of the substrate; evacuating gas from the conduit path to an area outside the vacuum chamber; and shielding the vacuum chamber from the gas being evacuated from the conduit path.

According to a further aspect of the invention, there is provided a lithographic apparatus comprising: means for providing a beam of radiation; means for imparting a pattern to a cross-section of the beam of radiation to form a patterned beam of radiation; a substrate table for holding a substrate; means for generating a vacuum beam path for the beam of radiation within a vacuum chamber; means for projecting the patterned beam onto a target portion of the substrate; a conduit inside the vacuum chamber; a first conduit path for at least a part of the first conduit; means for shielding the vacuum chamber from the first conduit path; means for providing a gas evacuation path from the first conduit path into an area outside the vacuum chamber, and shielding the vacuum chamber from the first gas evacuation path.

According to a further aspect of the invention, there is provided a lithographic apparatus comprising: a vacuum chamber provided with a first gas evacuator to generate a vacuum beam path for a beam of radiation; a first conduit inside the vacuum chamber; a first conduit shield inside the vacuum chamber, providing a first conduit path for at least a part of the first conduit, and shielding the vacuum chamber from the first conduit path; a first gas passage through the first conduit shield; a separate gas evacuation feedthrough through a wall of the vacuum chamber; and a gas evacuation shield extending at least between the first gas passage and the separate gas evacuation feedthrough, providing a gas evacuation path from the first conduit path into an area outside the vacuum chamber, and shielding the vacuum chamber from the first gas evacuation path.

According to a further aspect of the invention, there is provided a method of manufacturing a device, comprising: providing a vacuum to a vacuum chamber; projecting a patterned beam of radiation onto a target portion of a substrate within the vacuum chamber; effecting communication between a conduit extending within a conduit path and a component inside the vacuum chamber; shielding the vacuum chamber from the conduit path for at least a part of the conduit; evacuating gas from the conduit path to an area outside the vacuum chamber; and shielding the vacuum chamber from the gas being evacuated from the conduit path.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
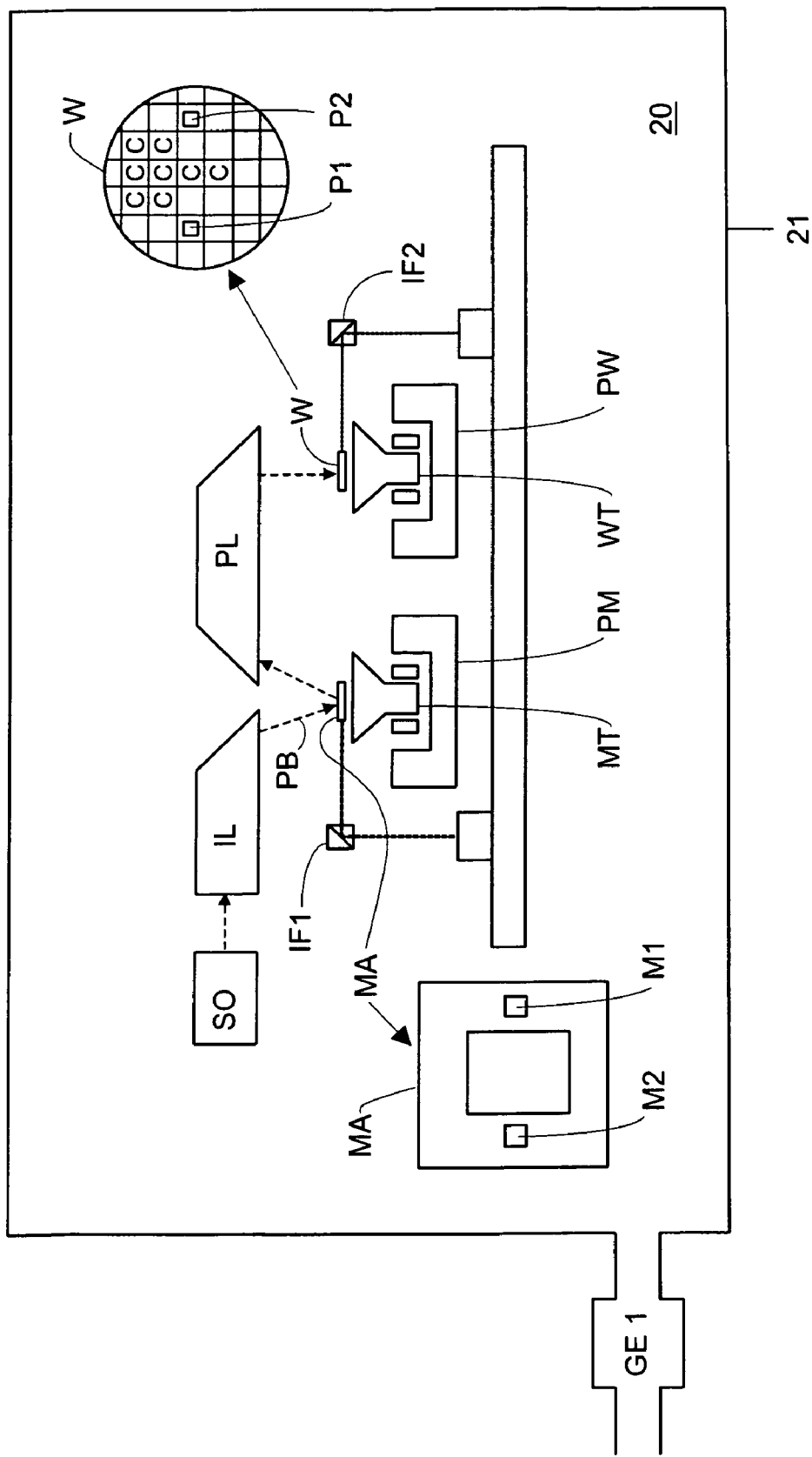
FIG. 1 depicts a lithographic apparatus according to an embodiment of the invention.

Reference is first made to FIG. 1, which schematically depicts a lithographic apparatus according to an embodiment of the invention. The apparatus comprises: an illumination system (illuminator) IL for providing a projection beam PB of radiation (e.g. UV or EUV radiation); a first support structure (e.g. a mask table) MT for supporting patterning device (e.g. a mask) MA and connected to first positioning structure PM for accurately positioning the patterning device with respect to item PL; a substrate table (e.g. a wafer table) WT for holding a substrate (e.g. a resist-coated wafer) W and connected to second positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W. With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structures PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

The systems of the lithographic projection apparatus according to an embodiment of the present invention are provided in a vacuum chamber 20 bound by a wall 21. The vacuum inside the vacuum chamber 20 can be created with a first gas evacuator GE1, for example a pump.

Much equipment is associated with the first support structure MT or the substrate table WT, such as alignment sensors, air bearings with differential vacuum seals, positioning motors and actuators which require utilities such as power, control signals, gasses and supply utilities such as measurement signals and further control signals. These utilities are supplied by conduits such as, for example, hoses, pipes, electrical cables etc.

In a vacuum environment, materials like plastics and elastomers outgas continuously and hollow sections of constructions like screw joints tend to increase gas load by releasing gasses, mainly water and hydrocarbons.

In order to reduce the distortion of the vacuum, the conduits providing utilities to the first support structure MT or the substrate table WT are shielded from other parts of the vacuum chamber 20 by conduit shields. This helps to meet the vacuum requirements by reducing the amount of hydrocarbons exposed in the vacuum chamber 20 and also helps reducing the risks in case of the rupture of a coolant line, because gasses released by the conduit remain in the shielded space and do not affect the main vacuum.

Figure 2:
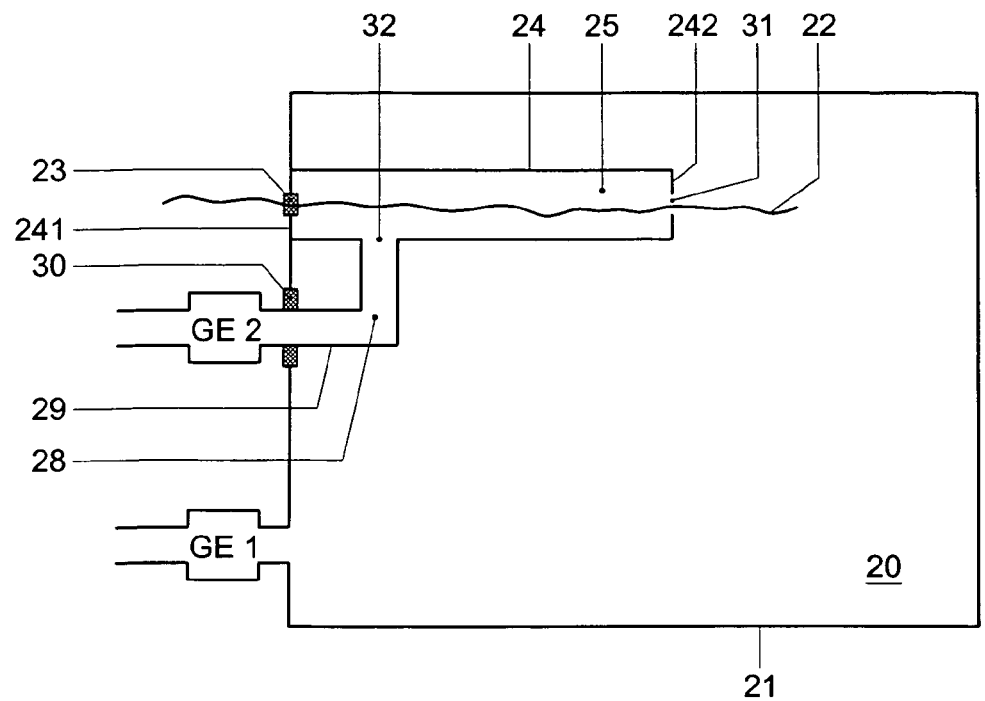
FIG. 2 schematically shows an example of a first embodiment of a vacuum system of a lithographic apparatus according to an embodiment of the invention.

Reference is now made to FIG. 2. As mentioned above, the lithographic apparatus comprises a vacuum chamber 20 having a wall 21. The vacuum chamber 20 is provided with a first gas evacuator GE1 for generating a vacuum beam path for the projection beam. The lithographic apparatus further comprises a conduit 22 in communication with a component inside the vacuum chamber 20. The conduit 22 may for example provide utilities such as electrical power, water, control signals and gases to the component. A conduit shield 24 inside the vacuum chamber 20 provides a conduit path 25 for at least a part of the conduit 22, and shields the vacuum chamber 20 from the conduit path 25.

Through the wall 21 there is a conduit feedthrough 23, via which feedthrough the conduit 22 extends through the wall 21. The feedthrough 23 preferably is a vacuum tight feedthrough. It is remarked that the conduit feedthrough 23 may be shared simultaneously by the conduit 22 and other (not shown) conduits. Also, the conduit path 25 may be shared simultaneously by the conduit 22 and other conduits. It is furthermore remarked that the conduit feedthrough 23 through the wall 21 may be absent, for instance when the conduit 22 does not extend through the wall 21. This may be the case when the conduit 22 serves for communication between different components inside the vacuum chamber 20, instead of for communication between a component inside the vacuum chamber and an object outside the vacuum chamber 20.

The apparatus further comprises a gas passage 32 through the conduit shield 24 and a separate gas evacuation feedthrough 30 through the wall 21. The separate gas evacuation feedthrough 30 is separate from the conduit feedthrough 23, and, whether or not the conduit feedthrough 23 is present, the conduit 22 does not extend via the separate gas evacuation feedthrough 30 through the wall 21. A gas evacuation shield 29 extends at least between the gas passage 32 and the separate gas evacuation feedthrough 30. The gas evacuation shield 29 provides a gas evacuation path 28 from the conduit path 25 into an area outside the vacuum chamber 20 and shields the vacuum chamber 20 from the gas evacuation path 28.

In the embodiment of FIG. 2 the conduit shield 24 has a tube-shape. The conduit shield 24 preferably has a clean, non-outgassing surface, in order not to affect the main vacuum. One end 241 of the tube 24 is fixedly connected to the wall 21 in such way that the conduit 22 extends through this end 241 of the tube 24 via the conduit feedthrough 23. At its other end 242, the tube 24 ends freely inside the vacuum chamber 20. The other end 242 of the tube 24 is closed, except for a feedthrough 31 through the tube 24. Via this feedthrough 31, the conduit 22 and optional other conduits are lead from the conduit path 25 into the vacuum chamber 20, where the conduit 22 for example can be connected to a component (not shown in FIG. 2) of the lithographic apparatus, such as the substrate table WT or otherwise.

In the embodiment of FIG. 2, the gas evacuation shield 29 is connected to a second gas evacuator GE2, which provides a vacuum for the conduit path 25. Even if the feedthrough 31, through which the conduit 22 leads from the conduit path 25 into the vacuum chamber 20, is not a vacuum tight feedthrough, the outgassing load of the conduit 22 to the vacuum chamber 20 can remain restricted, since the gas evacuation flow through the gas passage 32 may be more important than and greater than the gas leakage flow through the feedthrough 31. By suitably controlling the second gas evacuator GE2, the intensity of the gas evacuation flow through the gas passage 32 can be further increased. An advantage of the feedthrough 31 not being vacuum tight, is that the conduit 22 can move freely through such feedthrough 31.

Figure 3:
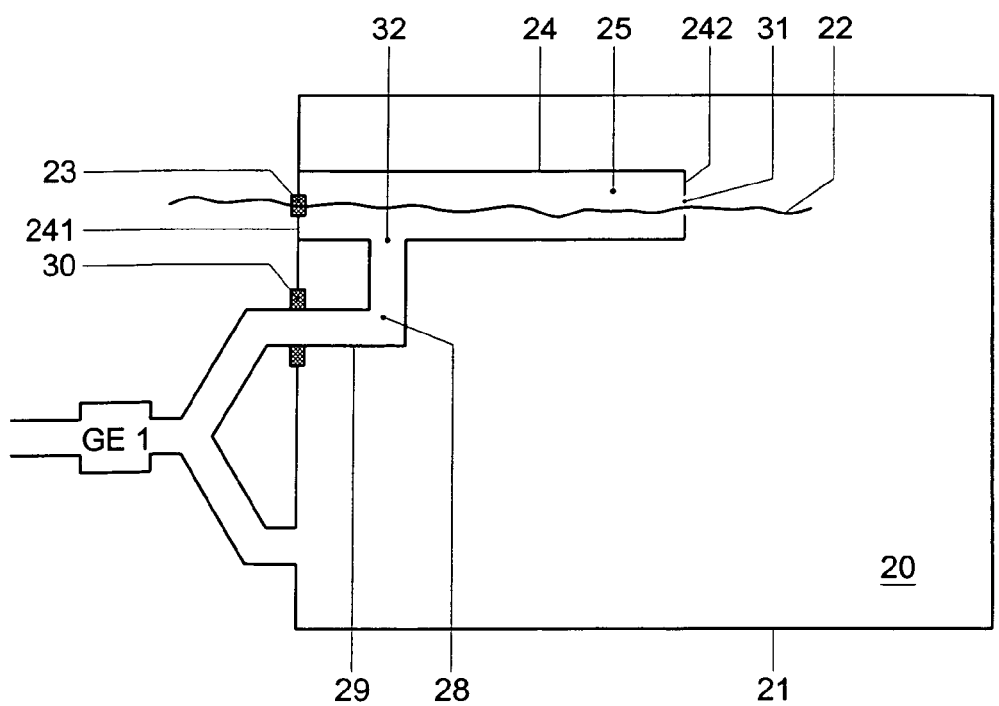
FIG. 3 schematically shows an example of a second embodiment of a vacuum system of a lithographic apparatus according to an embodiment of the invention.

Reference is now made to FIG. 3, which schematically shows an example of a second embodiment of a vacuum system of a lithographic apparatus according to an embodiment of the invention. In this embodiment, the first gas evacuator GE1 is coupled to the gas evacuation shield 29. In this way, the first gas evacuator GE1 can not only generate a vacuum beam path in the vacuum chamber 20, but can also provide a vacuum for the conduit path 25.

Figure 4:
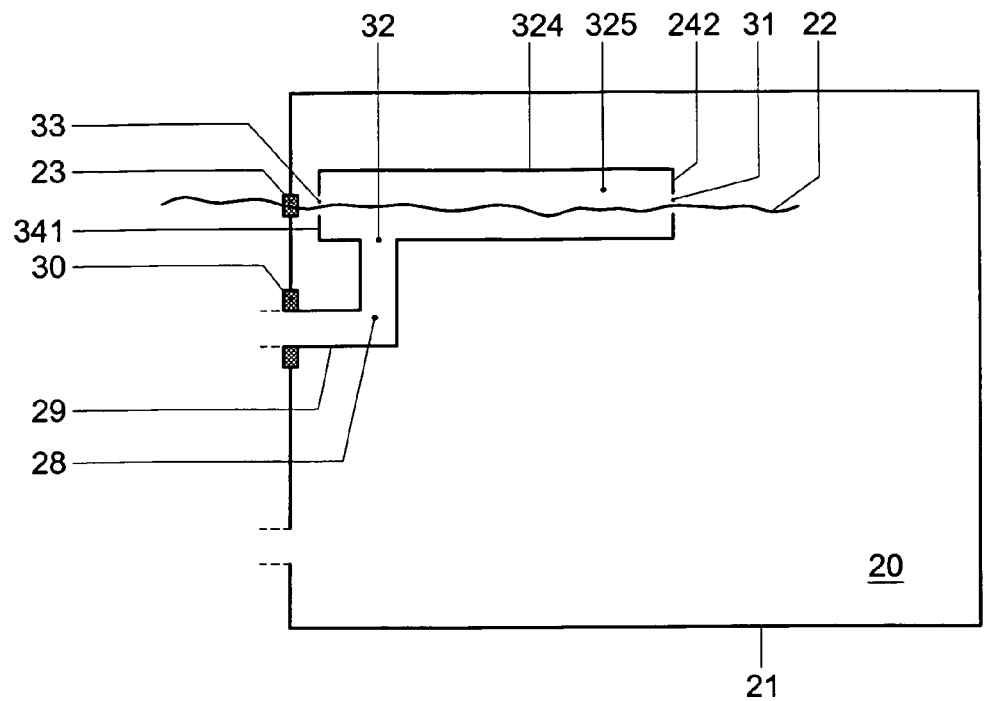
FIG. 4 schematically shows an example of a third embodiment of a vacuum system of a lithographic apparatus according to an embodiment of the invention.

Reference is now made to FIG. 4, which schematically shows an example of a third embodiment of a vacuum system of a lithographic apparatus according to an embodiment of the invention. In this embodiment, the conduit shield 324 is spaced from the conduit feedthrough 23 in the side wall 21. This means that the conduit path 325, unlike the embodiments of FIGS. 2 and 3, is not mechanically in contact with the wall 21 and a spacing is present between the tube 324 and the wall 21. In this embodiment, at the end 341 the tube 324 ends freely inside the vacuum chamber 20. The end 341 of the tube 324 is closed, except for a second feedthrough 33 through the tube 24. The second feedthrough 33 is of similar type as the feedthrough 31 through the other end 242 of the tube 324. Via this second feedthrough 33 the conduit 22 and optional other conduits are lead from the vacuum chamber 20 into the tube 324.

Figure 5:
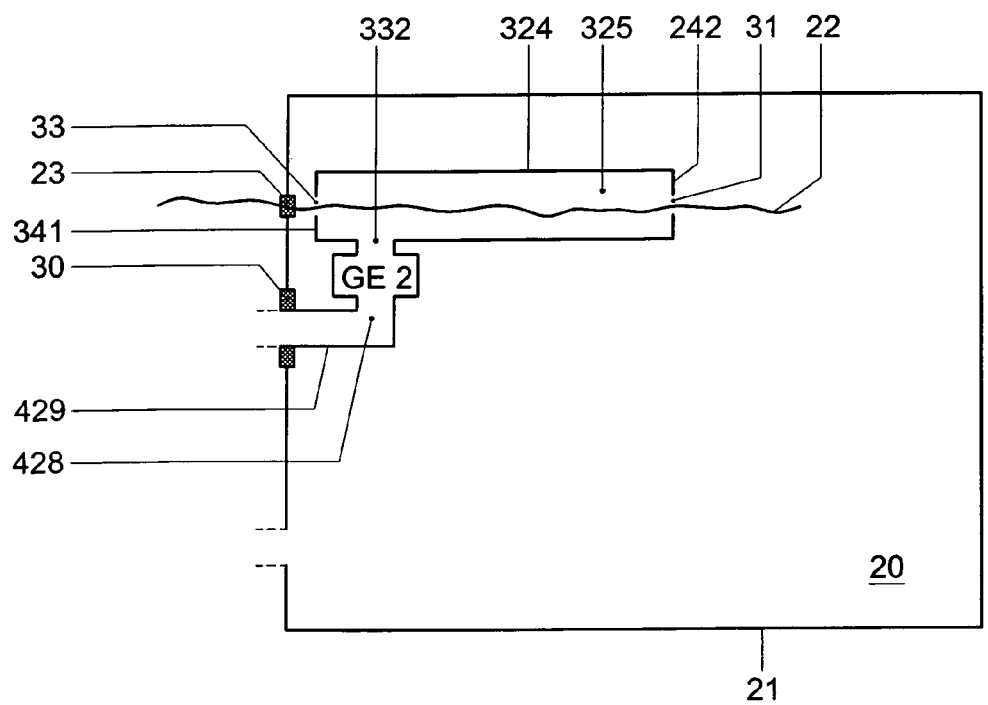
FIG. 5 schematically shows an example of a fourth embodiment of a vacuum system of a lithographic apparatus according to an embodiment of the invention.

Reference is now made to FIG. 5, which schematically shows an example of a fourth embodiment of a vacuum system of a lithographic apparatus according to an embodiment of the invention. In the embodiment of FIG. 5 the second gas evacuator GE2 is coupled to the gas evacuation shield 429, and the gas evacuation path 428 at a location inside the vacuum chamber 20, which location is at or nearby the gas passage 332. Thereby the efficiency of gas evacuation out of the conduit path 325 can be further improved, because the second gas evacuator GE2 is located close to the conduit path 25. A suitable example of a second gas evacuator GE2 for use in this embodiment, is for instance a cryopump that is able to operate in a vacuum environment.

It is remarked that for both the third embodiment of FIG. 4 and the fourth embodiment of FIG. 5, the first gas evacuator GE1 can optionally be coupled to the gas evacuation shield 29 as described for the second embodiment of FIG. 3.

Figure 6:
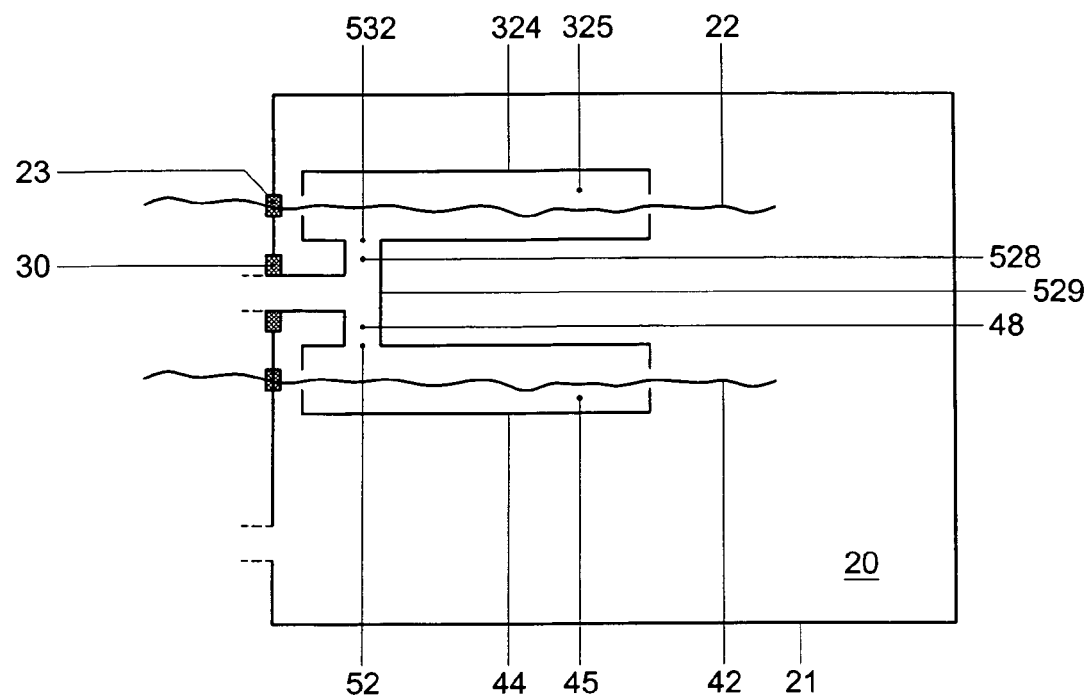
FIG. 6 schematically shows an example of a fifth embodiment of a vacuum system of a lithographic apparatus according to an embodiment of the invention.

Reference is now made to FIG. 6, which schematically shows an example of a fifth embodiment of a vacuum system of a lithographic apparatus according to an embodiment of the invention. The shown lithographic apparatus further comprises a second conduit 42 in communication with a component inside the vacuum chamber 20, and a second conduit shield 44 inside the vacuum chamber 20. The second conduit shield 44 provides a second conduit path 45 for at least a part of the second conduit 42, and shields the vacuum chamber 20 from the second conduit path 45. Through the second conduit shield 44 there is a second gas passage 52. The gas evacuation shield 529 furthermore extends between the second gas passage 52 and the separate gas evacuation feedthrough 30, furthermore provides a second gas evacuation path 48 from the second conduit path 45 into an area outside the vacuum chamber, and furthermore shields the vacuum chamber 20 from the second gas evacuation path 48. The gas evacuation shield 529 furthermore extends between the first gas passage 532 and the separate gas evacuation feedthrough 30, furthermore provides a second gas evacuation path 528 from the first conduit path 325 into an area outside the vacuum chamber, and furthermore shields the vacuum chamber 20 from the first gas evacuation path 528.

In the example of FIG. 6, the gas evacuation shield provides gas evacuation pathes for two conduit pathes. However, it is likewise possible that the gas evacuation shield provides gas evacuation pathes for three or more conduit pathes in a similar way.

Figure 7:
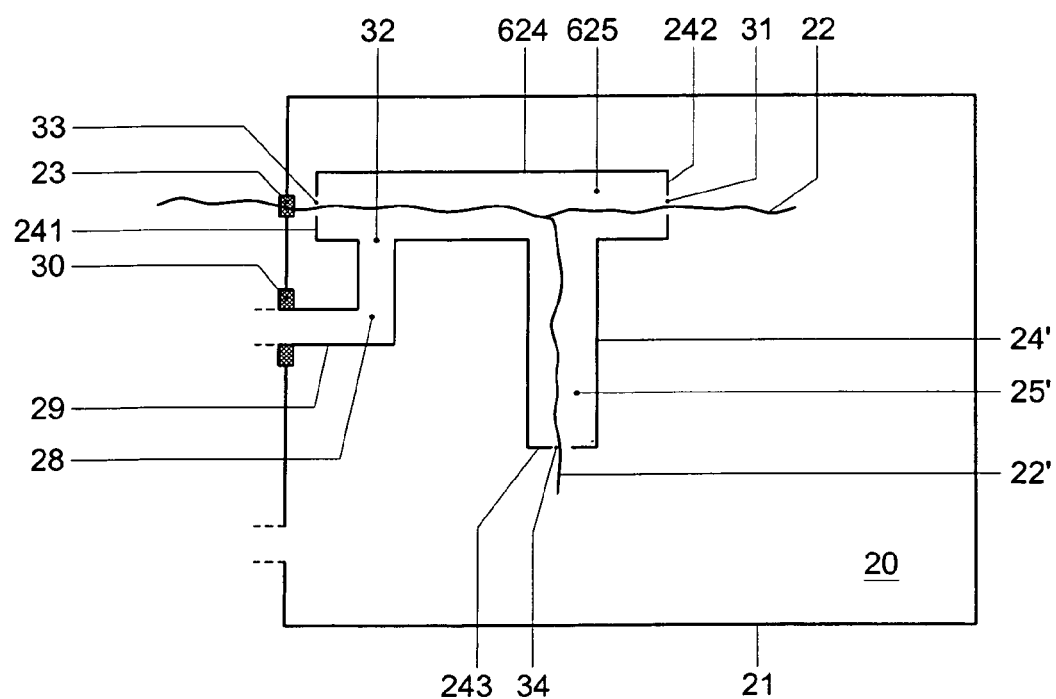
FIG. 7 schematically shows an example of a sixth embodiment of a vacuum system of a lithographic apparatus according to an embodiment the invention.

Reference is now made to FIG. 7, which schematically shows an example of a sixth embodiment of a vacuum system of a lithographic apparatus according to an embodiment of the invention. In this embodiment the conduit shield 624 further comprises a branched conduit shield 24', providing a branched conduit path 25', and shielding the vacuum chamber 20 from the branched conduit path 24'. The branched conduit shield 24' extends from the conduit shield 625. The branched conduit shield 24' has a tube-shape and there is a feedthrough 34 in the free end 243 of the tube 24', which feedthrough 34 is similar to the feedthroughs 31 and 33 in the tube 624. The branched conduit shield 24' contains a conduit 22', which can for example be a branch of the conduit 22, but which may also be another conduit. In last mentioned case, the conduit 22' can for example lead from outside the vacuum chamber 20 consecutively through the feedthroughs 23, 33 and 34 to a second component in the vacuum chamber 20. As another example, the conduit 22' may lead from a first component in the vacuum chamber 20 consecutively through the feedthroughs 31 and 34 to a second component in the vacuum chamber 20.

In the example of FIG. 7, the conduit shield comprises one branched conduit shield, providing a branched conduit path, and shielding the vacuum chamber from the branched conduit path. However, it is likewise possible that the conduit shield comprises two or more branched conduit shields in a similar way, and that such branched conduit shields comprise sub-branch conduit shields.

While specific embodiments of the invention have been described above, it will be appreciated that aspects of the invention may be practiced otherwise than as described. For example, different devices described in the above embodiments and illustrated by the different drawings can be combined with each other in many different ways. For instance, a combination is possible between the embodiments shown in FIGS. 6 and 7, wherein the gas evacuation shield provides gas evacuation pathes for two or more conduit pathes, each conduit path optionally having different branches and sub-branches. The fact that aspects of the invention provides the possibility of making such combinations, further contributes to improvements in adaptability in the numbers, types and trajectories of conduits in a lithographic apparatus. The description is not intended to limit the aspects of the invention.

What is claimed is:

1. A lithographic apparatus comprising:
    an illumination system constructed to provide a beam of radiation;
    a support structure constructed to support a patterning device, said patterning device serving to impart a cross-section of said beam of radiation with a pattern to form a patterned beam;
    a substrate table for holding a substrate;
    a vacuum chamber provided with a first gas evacuator to generate a vacuum beam path for said beam of radiation;
    a projection system that projects said patterned beam onto a target portion of said substrate;
    a first conduit inside said vacuum chamber;
    a first conduit feedthrough through a wall of said vacuum chamber, said first conduit feedthrough constructed to allow the first conduit to pass through the wall;
    a first conduit shield inside said vacuum chamber, providing a first conduit path for at least a part of said first conduit, and shielding said vacuum chamber from said first conduit path;
    a first gas passage through said first conduit shield;
    a separate gas evacuation feedthrough through the wall of said vacuum chamber, said separate gas evacuation feedthrough being separate from said first conduit feedthrough; and
    a gas evacuation shield extending at least between said first gas passage and said separate gas evacuation feedthrough, providing a gas evacuation path from said first conduit path into an area outside said vacuum chamber, and shielding said vacuum chamber from said first gas evacuation path.

2. A lithographic apparatus according to claim 1, wherein said first conduit shield is spaced from said first conduit feedthrough.

3. A lithographic apparatus according to claim 1, wherein said first gas evacuator is coupled to said first gas evacuation shield.

4. A lithographic apparatus according to claim 1, further comprising:
    a second gas evacuator coupled to said first gas evacuation shield.

5. A lithographic apparatus according to claim 1, further comprising:
    a second conduit inside said vacuum chamber;
    a second conduit shield inside said vacuum chamber, providing a second conduit path for at least a part of said second conduit, and shielding said vacuum chamber from said second conduit path;
    a second gas passage through said second conduit shield;
    wherein said first gas evacuation shield furthermore extends between said second gas passage and said separate gas evacuation feedthrough, and furthermore provides a second gas evacuation path from said second conduit path into an area outside said vacuum chamber, and furthermore shields said vacuum chamber from said second gas evacuation path.

6. A lithographic apparatus according to claim 1, wherein said first conduit shield includes a branched conduit shield, providing a branched conduit path, and shielding said vacuum chamber from said branched conduit path.

7. A method of manufacturing a device, comprising:
    providing a substrate;
    providing a beam of radiation;
    providing a vacuum to a vacuum chamber;
    effecting communication between a conduit passing through a conduit feedthrough in a wall of the vacuum chamber and extending within a conduit path, and a component inside the vacuum chamber;
    shielding the vacuum chamber from the conduit path for at least a part of the conduit;
    imparting a cross-sectional pattern to the beam of radiation and forming a patterned beam;
    projecting the patterned beam of radiation onto a target portion of the substrate;
    evacuating gas from the conduit path, through a gas evacuation feedthrough in the wall of the vacuum chamber that is separate from the conduit feedthrough, and to an area outside the vacuum chamber; and
    shielding the vacuum chamber from the gas being evacuated from the conduit path.

8. A lithographic apparatus comprising:
    a vacuum chamber provided with a first gas evacuator to generate a vacuum beam path for a beam of radiation;
    a first conduit inside said vacuum chamber;
    a first conduit feedthrough through a wall of said vacuum chamber, said first conduit feedthrough constructed to allow the first conduit to pass through the wall;
    a first conduit shield inside said vacuum chamber, providing a first conduit path for at least a part of said first conduit, and shielding said vacuum chamber from said first conduit path;
    a first gas passage through said first conduit shield;
    a separate gas evacuation feedthrough through the wall of said vacuum chamber, said separate gas evacuation feedthrough being separate from said first conduit feedthrough; and
    a gas evacuation shield extending at least between said first gas passage and said separate gas evacuation feedthrough, providing a gas evacuation path from said first conduit path into an area outside said vacuum chamber, and shielding said vacuum chamber from said first gas evacuation path.

9. A method of manufacturing a device, comprising:
    providing a vacuum to a vacuum chamber;
    projecting a patterned beam of radiation onto a target portion of a substrate within the vacuum chamber;
    effecting communication between a conduit passing through a conduit feedthrough in a wall of the vacuum chamber and extending within a conduit path, and a component inside the vacuum chamber;
    shielding the vacuum chamber from the conduit path for at least a part of the conduit;
    evacuating gas from the conduit path, through a gas evacuation feedthrough in the wall of the vacuum chamber that is separate from the conduit feedthrough, and to an area outside the vacuum chamber; and
    shielding the vacuum chamber from the gas being evacuated from the conduit path.

10. A lithographic apparatus comprising:

an illumination system constructed to provide a beam of radiation;

a support structure constructed to support a patterning device, said patterning device serving to impart a cross-section of said beam of radiation with a pattern to form a patterned beam;

a substrate table for holding a substrate;

a vacuum chamber provided with a first gas evacuator to generate a vacuum beam path for said beam of radiation;

a projection system that projects said patterned beam onto a target portion of said substrate;

a first conduit inside said vacuum chamber;

a first conduit shield inside said vacuum chamber, providing a first conduit path for at least a part of said first conduit, and shielding said vacuum chamber from said first conduit path;

a first gas passage through said first conduit shield;

a separate gas evacuation feedthrough through a wall of said vacuum chamber;

a gas evacuation shield extending at least between said first gas passage and said separate gas evacuation feedthrough, providing a gas evacuation path from said first conduit path into an area outside said vacuum chamber, and shielding said vacuum chamber from said first gas evacuation path;

a second conduit inside said vacuum chamber;

a second conduit shield inside said vacuum chamber, providing a second conduit path for at least a part of said second conduit, and shielding said vacuum chamber from said second conduit path;

a second gas passage through said second conduit shield;

wherein said first gas evacuation shield furthermore extends between said second gas passage and said separate gas evacuation feedthrough, and furthermore provides a second gas evacuation path from said second conduit path into an area outside said vacuum chamber, and furthermore shields said vacuum chamber from said second gas evacuation path.

* * * * *